(12) United States Patent
Mandviwala et al.

(10) Patent No.: US 9,952,346 B2
(45) Date of Patent: Apr. 24, 2018

(54) FIBER OPTIC MAGNETIC FIELD SENSING SYSTEM BASED ON LORENTZ FORCE METHOD FOR DOWNHOLE APPLICATIONS

(71) Applicant: Halliburton Energy Services, Inc., Houston, TX (US)

(72) Inventors: Tasneem Mandviwala, Katy, TX (US); Han-sun Choi, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 56 days.

(21) Appl. No.: 15/032,239

(22) PCT Filed: Nov. 26, 2013

(86) PCT No.: PCT/US2013/072040
§ 371 (c)(1),
(2) Date: Apr. 26, 2016

(87) PCT Pub. No.: WO2015/080706
PCT Pub. Date: Jun. 4, 2015

(65) Prior Publication Data
US 2016/0274262 A1 Sep. 22, 2016

(51) Int. Cl.
*G01V 3/00* (2006.01)
*G01V 3/26* (2006.01)
*G01R 33/032* (2006.01)

(52) U.S. Cl.
CPC .............. *G01V 3/26* (2013.01); *G01R 33/032* (2013.01); *G01R 33/0327* (2013.01)

(58) Field of Classification Search
CPC ... G01V 3/28; G01V 3/38; G01V 3/18; G01V 3/20; G01V 3/22; G01V 3/24; G01V 3/26;
(Continued)

(56) References Cited

U.S. PATENT DOCUMENTS 4,656,422 A * 4/1987 Vail, III ............... G01R 33/022
324/300
4,675,522 A 6/1987 Arunkumar
(Continued)

FOREIGN PATENT DOCUMENTS

EP 0212915 A2 3/1987
JP 11-044743 A 2/1999

OTHER PUBLICATIONS

International Preliminary Report on Patentability issued in related Application No. PCT/US2013/072040, dated Jun. 9, 2016 (11 pages).
(Continued)

*Primary Examiner* — Thang Le
(74) *Attorney, Agent, or Firm* — John W. Wustenberg; Baker Botts L.L.P.

(57) ABSTRACT

A method and apparatus for magnetic sensing is described. The apparatus includes a strain-sensing fiber coupled to a conducting strip. The strain-sensing fiber may be, for example, a distributed feedback fiber with Bragg gratings. A current may be induced to flow on the conducting strip by electrically coupling a photodiode to the conducting strip and then activating a laser optically coupled to the photodiode. In the presence of a magnetic field, a Lorentz force will be exerted on the conducting strip, causing a displacement of the conducting strip that will induce strain on the strain-sensing fiber. The strain on the strain-sensing fiber may be measured by laser-pumping the strain-sensing fiber and measuring the reflected waves. The measured strain may be used to calculate the magnitude of the magnetic field. Multiple strain-sensing fibers may be optically coupled in series and deployed into a borehole for distributed magnetic field measurements. The magnetic field measurements may be used to determine the resistivity of formations surround-
(Continued)

ing the borehole and, for example, to monitor the movement of relatively-low resistivity water fronts.

20 Claims, 6 Drawing Sheets

(58) Field of Classification Search
CPC . G01V 3/30; G01V 3/10; G01V 3/265; G01V 3/02; G01V 3/04; G01V 3/06; E21B 47/026; E21B 47/122; E21B 47/0905; E21B 47/09; E21B 47/011; E21B 47/12; E21B 47/101; E21B 47/102; G01N 27/223; G01N 33/246; G01R 27/18; G01R 33/032; G01R 27/20; G01R 33/0327
USPC ........ 324/324–375; 340/853.1–853.9, 854.1, 340/855.1–855.9, 856.1–856.4
See application file for complete search history.

(56) References Cited

U.S. PATENT DOCUMENTS

| | | | |
|---|---|---|---|
| 5,513,913 A | 5/1996 | Ball et al. | |
| 5,844,927 A | 12/1998 | Kringlebotn | |
| 5,898,517 A * | 4/1999 | Weis | E21B 47/123 356/32 |
| 6,766,703 B1 * | 7/2004 | Kluth | E21B 23/08 73/152.28 |
| 8,058,869 B2 | 11/2011 | Cranch et al. | |
| 2002/0196993 A1 * | 12/2002 | Schroeder | G01L 1/246 385/12 |
| 2004/0093950 A1 | 5/2004 | Bohnert | |
| 2009/0102474 A1 * | 4/2009 | Cranch | A01D 89/008 324/244.1 |
| 2011/0050234 A1 | 3/2011 | Dorovsky | |
| 2011/0139447 A1 * | 6/2011 | Ramos | E21B 47/09 166/254.2 |
| 2012/0176250 A1 * | 7/2012 | Duncan | G01V 11/002 340/853.2 |
| 2013/0089331 A1 * | 4/2013 | Kim | H04J 14/0232 398/72 |
| 2013/0279841 A1 | 10/2013 | Joinson | |
| 2013/0294720 A1 | 11/2013 | Koelman et al. | |

OTHER PUBLICATIONS

International Search Report and Written Opinion issued in related PCT Application No. PCT/US2013/072040 dated Aug. 22, 2014, 12 pages.

Okamura, Haruo. "Fiber-optic magnetic sensor utilizing the Lorentzian force." Lightwave Technology, Journal of 8.10 (1990): 1558-1564.

Cranch, G. A., Gordon MH Flockhart, and C. K. Kirkendall. "High-resolution distributed-feedback fiber laser dc magnetometer based on the Lorentzian force." Measurement Science and Technology 20.3 (2009): 034023.

* cited by examiner

FIBER OPTIC MAGNETIC FIELD SENSING SYSTEM BASED ON LORENTZ FORCE METHOD FOR DOWNHOLE APPLICATIONS

BACKGROUND

The present disclosure relates generally to oil field exploration and, more particularly, to a system and method for magnetic field sensing.

The use of electronic tools for magnetic field sensing is well known in the art of oil field production. Such tools measure magnetic fields, which may be generated from magnetic transmitters placed around a production oil well. The known electronic tools, however, have typically suffered from temperature sensitivity, relatively high loss, relatively slow speeds, and a lack of durability that makes permanent installation difficult. Further, electronic tools typically are capable of measuring magnetic fields only at a single point, and distributed measurements may be possible only by using multiple tools.

FIGURES

Some specific exemplary embodiments of the disclosure may be understood by referring, in part, to the following description and the accompanying drawings.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally to down-hole applications and, more particularly, to a system and method for magnetic field sensing.

Illustrative embodiments of the present disclosure are described in detail herein. In the interest of clarity, not all features of an actual implementation may be described in this specification. It will of course be appreciated that in the development of any such actual embodiment, numerous implementation-specific decisions must be made to achieve the specific implementation goals, which will vary from one implementation to another. Moreover, it will be appreciated that such a development effort might be complex and time-consuming, but would nevertheless be a routine undertaking for those of ordinary skill in the art having the benefit of the present disclosure.

To facilitate a better understanding of the present disclosure, the following examples of certain embodiments are given. In no way should the following examples be read to limit, or define, the scope of the disclosure. Embodiments of the present disclosure may be applicable to horizontal, vertical, deviated, multilateral, u-tube connection, intersection, bypass (drill around a mid-depth stuck fish and back into the well below), or otherwise nonlinear wellbores in any type of subterranean formation. Embodiments may be applicable to injection wells, and production wells, including natural resource production wells such as hydrogen sulfide, hydrocarbons or geothermal wells; as well as borehole construction for river crossing tunneling and other such tunneling boreholes for near surface construction purposes or borehole u-tube pipelines used for the transportation of fluids such as hydrocarbons. Embodiments described below with respect to one implementation are not intended to be limiting.

Figure 1:
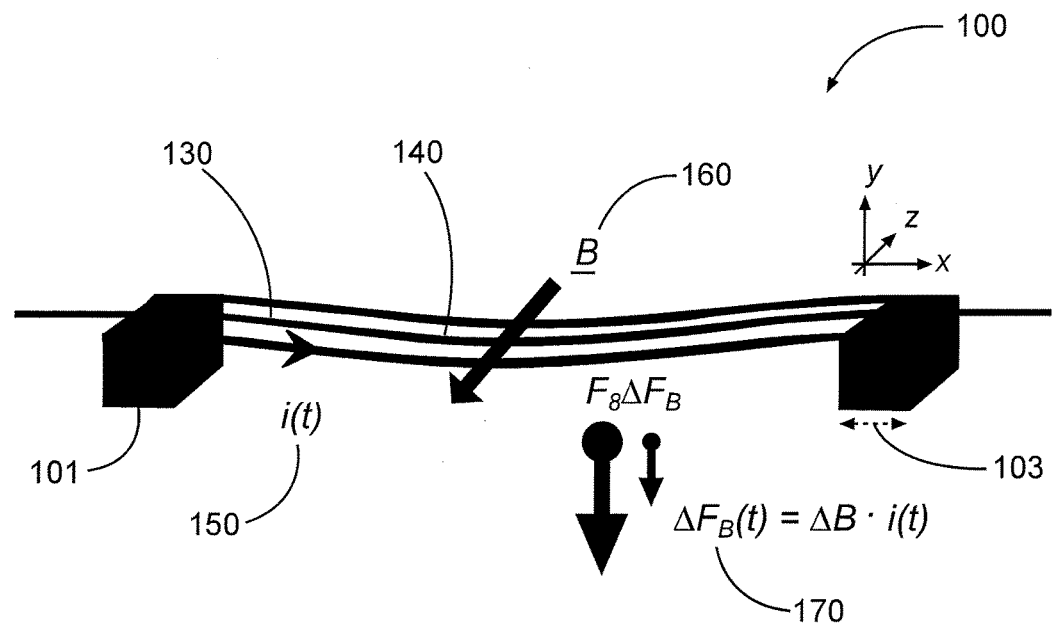
FIG. 1 illustrates an embodiment of a fiber-optic magnetic field sensing system.

FIG. 1 illustrates an embodiment of a fiber-optic magnetic field sensing system 100. A strain-sensing fiber 140 is coupled to a conducting strip 130 to form a composite structure coupled to supports 101 and 103. Conducting strip 130 may be of sufficient length and width to provide reliable and secure coupling to strain-sensing fiber 140 but, as is shown in the embodiment of FIG. 1, it may be relatively thin. Conducting strip 130 may conduct an electric current of known magnitude i(t), shown in FIG. 1 as electric current 150. When a magnetic field intersects an electric current, a Lorentz force is induced. Thus, in the presence of a magnetic field of magnitude B, shown in FIG. 1 as magnetic field 160, conducting strip 130 will experience a Lorentz force of magnitude $F_B(t)$ shown in FIG. 1 as Lorentz force 170. Lorentz force 170 may cause a deflection of conducting strip 130, which may in turn induce a corresponding strain on strain-sensing fiber 140 coupled to conducting strip 130. As will be discussed in greater detail below, the induced strain on strain-sensing fiber 140 may be measured and used to calculate the magnitude of magnetic field 160.

In the embodiment of FIG. 1, current 150 is shown flowing from left to right along the X-axis direction, magnetic field 160 is shown along the Z-axis direction from far to near, and therefore, as is well-known in the art, the Lorentz force 170 may be induced in a downward direction along the Y-axis. The change in Lorentz force 170 over time given known electric current 150 and magnetic field 160 is:

$$\Delta F_B(t) = \Delta B \cdot i(t)$$

Figure 2:
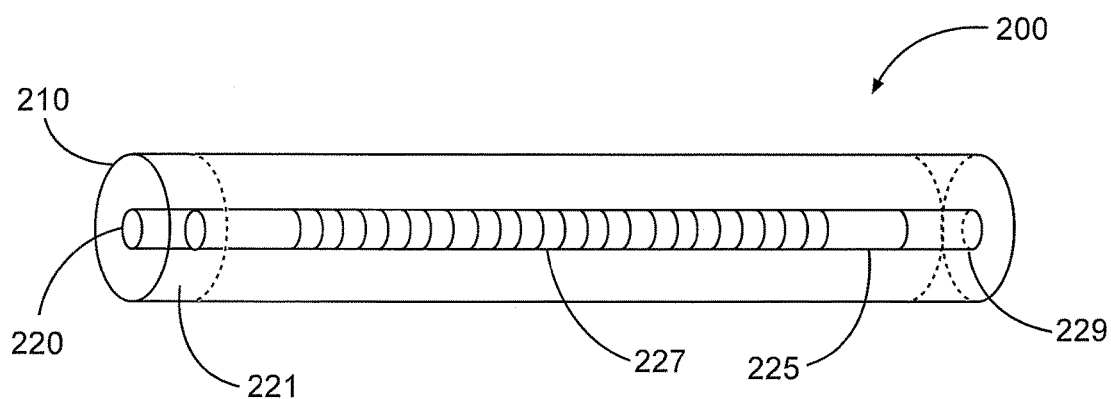
FIG. 2 illustrates an embodiment of a strain-sensing fiber.

FIG. 2 illustrates one embodiment of a strain-sensing fiber 200, called a distributed feedback fiber laser (DFB FL), which may be used as the strain-sensing fiber 140 in the embodiment of FIG. 1. The DFB FL 200 may comprise an optical fiber 210 with a fiber core 220. The fiber core 220 may comprise a length of single-mode, erbium-doped fiber 225 spliced at either end to passive fiber 221 and 229. The erbium-doped fiber 225 may be, for example, 50 mm in length and have a single Bragg grating 227. The distributed-feedback structure may be a quarter-wave configuration, formed with a single π phase shift in the center of the grating. The erbium-doped fiber 225 may be pumped with a semi-conductor laser at a wavelength of, for example, 980 nanometers or 1480 nanometers. The Bragg grating 227 may generate reflected emission wave, the wavelength of which may be determined primarily by the pitch of Bragg grating 227 and may be at various points within the erbium window of, for example, 1525 nanometers to 1560 nanometers.

The DFB FL 200 may support a single fundamental mode, the center of which may be located about the phase shift. Thus, when strain is applied, the lasing frequency of the fundamental mode may shift, causing the reflected emission frequency to shift. Fiber interferometers may be used to decode such dynamic strain signals by converting the reflected light into intensity fluctuations. The phase of the interference signal may contain information about the reflected emission frequency shift. The DFB FL 200 may thereby be used to resolve strain frequency shifts as low as 118 $f\epsilon/Hz^{1/2}$.

DFB FL 200 may be low loss, high speed, accurate despite temperature variation, and physically robust. As a person of ordinary skill in the art will appreciate in light of the present disclosure, the DFB FL 200 may therefore provide excellent environmental stability and be well-suited for permanent deployment downhole in a harsh production-well environment.

As discussed with respect to the embodiment of FIG. 1, in the presence of a magnetic field of magnitude B, conducting strip 130 carrying a current i(t) will experience a Lorentz force $F_B(t)$ that may induce a displacement of conducting strip 130 and a corresponding strain on strain-sensing fiber 140. In embodiments where the strain-sensing fiber 140 is a DFB FL, such DFB FL 200 shown in FIG. 2, the frequency shift induced in the strain-sensing fiber may be calculated as:

$$\frac{\Delta v_s}{v_s} = (0.78)\kappa d_n \frac{B \cdot i}{E_{\text{eff}} I_{z\_\text{eff}}} \int_0^l \left(-\frac{1}{2}x^2 + \frac{1}{2}x - \frac{l^2}{12}\right) \exp(-2\kappa|x - x_\phi|) dx$$

where $\Delta v_s$ is the strain-sensing fiber frequency shift, $\kappa$ is the fiber laser coupling co-efficient, $d_n$ is the distance between a neutral surface and the longitudinal plane where strain is induced, $E_{\text{eff}}$ and $I_{z\_\text{eff}}$ are effective Young's modulus and second moment of area of the conducting strip 130, l is the length of the strain-sensing fiber 140, and $x_\phi$ is the position of the phase shift relative to the edge of the conducting strip 130. The frequency shift may be converted to intensity modulation by an interferometer, as discussed with respect to the embodiment of FIG. 2. In this way, changes in the magnetic field, which affect the magnitude in the Lorentz force displacement, may be measured by strain-sensing fibers 140.

Figure 3:
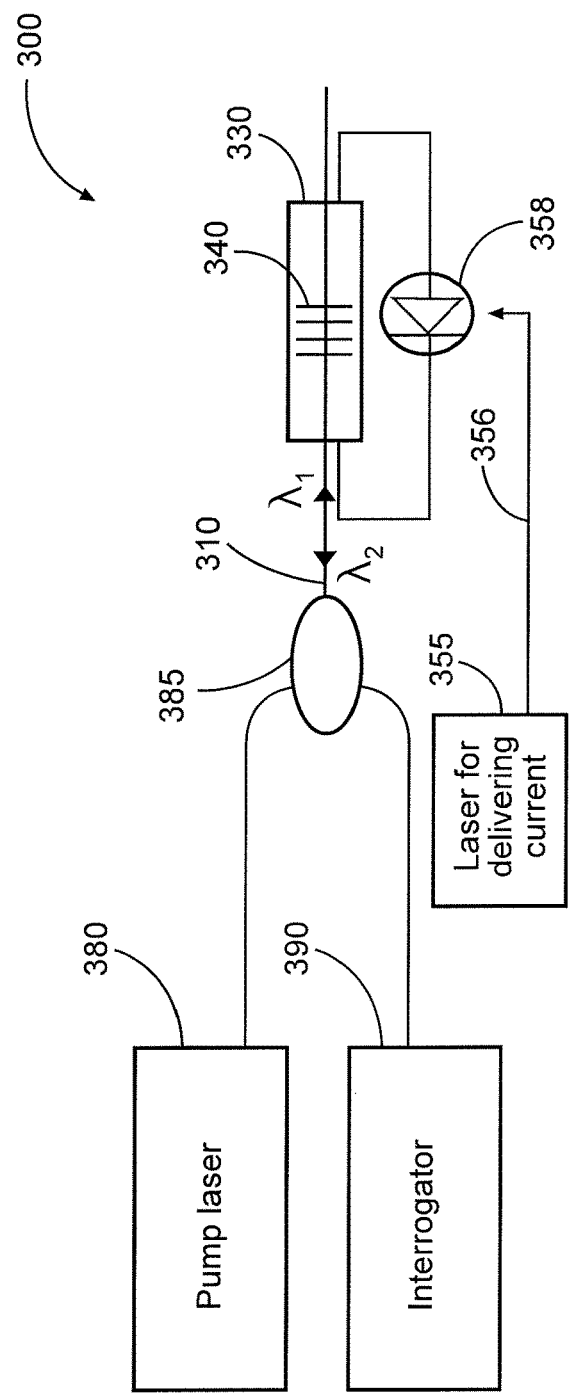
FIG. 3 is a block diagram of a fiber-optic magnetic field sensing system.

FIG. 3 is a block diagram of a fiber-optic magnetic field sensing system 300. In the embodiment of FIG. 3, a conducting metal strip 330 (similar to conducting strip 130) is shown coupled to a strain-sensing fiber 340. Strain-sensing fiber 340 may be a DFB FL-type strain-sensing fiber as shown in FIG. 2, or may be an alternative strain-sensing fiber known to those of skill in the art, such as a distributed Bragg reflector-type strain-sensing fiber.

In this embodiment, a laser for delivering current 355 is shown as optically coupled to a photodiode 358 via a fiber for delivering current 356. Photodiode 358, in turn, is shown as being electrically coupled to conducting metal strip 330. Laser for delivering current 355 may transmit optical power over fiber for delivering current 356, and photodiode 358 may convert that optical power into an electrical current flowing through conducting metal strip 330, similar to the electrical current 150 shown in FIG. 1.

The embodiment of FIG. 3 shows two communications paths through strain-sensing fiber 340 along an optical fiber 310. Input optical power, shown as having wavelength $\lambda_1$, is generated at pump laser 380 and is transmitted along the optical fiber 310 to strain-sensing fiber 340 via a wavelength-division multiplexer ("WDM") coupler 385. The reflected signal emitted from strain-sensing fiber 340, shown as having wavelength $\lambda_2$, is transmitted along the optical fiber 310 to an interrogator 390 via the WDM coupler 385. WDM coupler 385 may be, for example, an optical circulator with three ports, such that input optical power from pump laser 380 arrive at one port and are transmitted out a second port to strain-sensing fiber 340, while the reflected emissions frequency emitted from strain-sensing fiber 340 arrive at the second port and are transmitted out a third port to interrogator 390. Interrogator 390 may be, for example, a demodulator including a fiber interferometer, as described above with respect to the embodiment of FIG. 3, for using the signal reflected from strain-sensing fiber 340 to calculate the strain on strain-sensing fiber 340.

Figure 4:
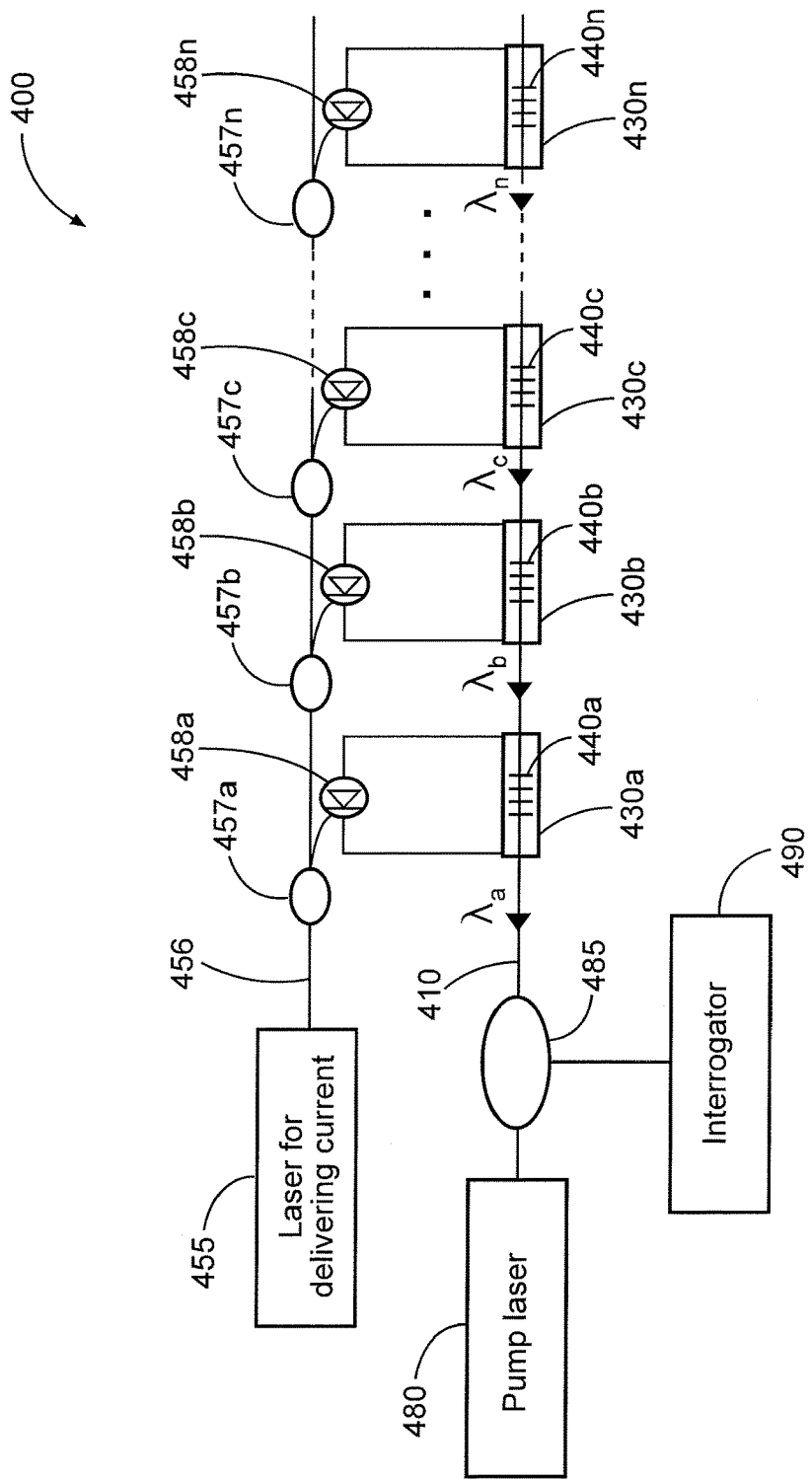
FIG. 4 is a block diagram of a distributed fiber-optic magnetic field sensing system.

FIG. 4 is a block diagram of a distributed fiber-optic magnetic field sensing system 400. The embodiment of FIG. 4 is similar to the embodiment of FIG. 3, however instead of a single conducting metal strip 330, strain-sensing fiber 340, and photodiode 358, the embodiment of FIG. 4 may include two or more conducting metal strips $430_{a-n}$, strain-sensing fibers $440_{a-n}$, and photodiodes $458_{a-n}$. As will be discussed below, each strain-sensing fiber 440 may provide a single magnetic field measurement point. The number of strain-sensing fibers $440_{a-n}$ (and correspondingly, the number of conducting metal strips $430_{a-n}$ and photodiodes $458_{a-n}$) may be selected based on the number of measurement points desired in the distributed fiber-optic magnetic field sensing system 400.

A single laser for delivering current 455 is shown, similar to laser for delivering current 355. Laser for delivering current 455 may transmit optical power over fiber for delivering current 456. The fiber for delivering current 456 may be optically coupled to each of the plurality of photodiodes $458_{a-n}$ via a plurality of optical splitters $457_{a-n}$. As a person of ordinary skill in the art will appreciate in light of this disclosure, the optical splitters $457_{a-n}$ and photodiodes $458_{a-n}$ may be configured such that equal amounts of current will be induced to flow through each of the conducting strips $430_{a-n}$. In an alternative embodiment, discussed below with respect to FIG. 7, current may be delivered to conducting strips $430_{a-n}$ directly using a DC current source, which may obviate the use of optical splitters $457_{a-n}$ and photodiodes $458_{a-n}$.

A pump laser 480 is shown that may generate input optical power that is transmitted to strain-sensing fibers $440_{a-n}$, along an optical fiber 410 via WDM coupler 485. Reflected signals emitted from strain-sensing fibers $440_{a-n}$, shown as having wavelengths $\lambda_{a-n}$, may be transmitted back along the optical fiber 410 through WDM coupler 485 and may be received at interrogator 490. As a person of ordinary skill in the art will appreciate in light of this disclosure, the interrogator may be a demodulator including one or more interferometers that may calculate the strain on each of strain-sensing fibers $440_{a-n}$ using the signals reflected from the strain-sensing fibers $440_{a-n}$.

Figure 5:
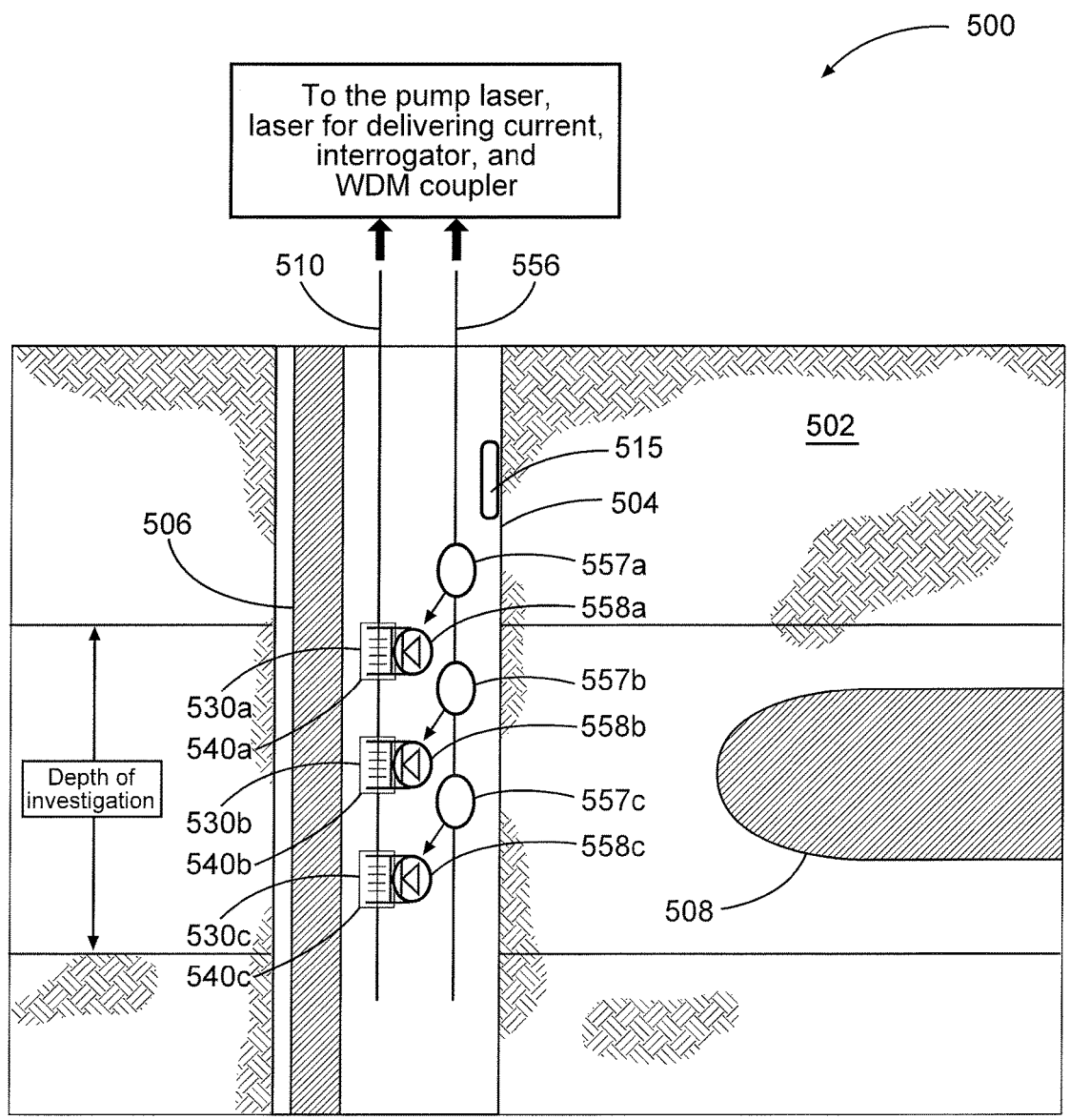
FIG. 5 illustrates an embodiment of a distributed fiber-optic magnetic field sensing system in a downhole configuration.

FIG. 5 illustrates an embodiment of a distributed fiber-optic magnetic field sensing system in a downhole configuration 500. In this embodiment, a distributed fiber-optic magnetic field sensing system, such as the system 400 of FIG. 4, is shown disposed in a borehole 504 within a subterranean formation 502. Borehole 504 is shown to be lined with a casing 506, and formation 502 is shown to contain a waterfront 508. The distributed fiber-optic magnetic field sensing system is shown disposed between casing 506 and formation 502. Borehole 504 may be part of an oil-well production environment and may contain oil-well production equipment (not shown) such as production tubing, a production packer, or other equipment known to those of skill in the art.

In the embodiment of FIG. 5, as with the embodiment of FIG. 4, a fiber for delivering current 556 may be connected to a plurality of photodiodes $558_{a-c}$ via a plurality of optical splitters $557_{a-c}$. Photodiodes $558_{a-c}$ may be electrically coupled to conducting strips $530_{a-c}$, and in turn conducting strips $530_{a-c}$ may be physically coupled to strain-sensing fibers $540_{a-c}$.

Although not shown, a laser for delivering current, a pump laser, an interrogator, and a WDM coupler may be located, for example, at the surface above subterranean formation 502 and borehole 504. The embodiment of FIG. 5 may thereby be configured similarly to the embodiment of FIG. 4. For example, fiber for delivering current 556 may be connected to the laser for delivering current, such that photodiodes $558_{a-c}$ may convert optical power delivered over fiber for delivering current 556 into electrical current to flow over conducting strips $530_{a-c}$. Similarly, strain-sensing fibers $540_{a-c}$ may be optically coupled to the pump laser and the interrogator via the WDM coupler. In this way, the pump laser may deliver input optical power that is transmitted along an optical fiber 510 to strain-sensing fibers $540_{a-c}$ via the WDM coupler, and reflected signals emitted from strain-sensing fibers $540_{a-c}$ may be transmitted back along the optical fiber 510 through the WDM coupler to be received at the interrogator.

In the embodiment of FIG. 5, a magnetic transmitter 515 is shown in borehole 504, proximate to strain-sensing fibers $540_{a-c}$. In alternative embodiments, magnetic transmitter may be positioned in other locations, such as at the surface outside of borehole 504. Magnetic transmitter 515 may transmit a magnetic field of known magnitude. For example, magnetic transmitter 515 may be coils of wire carrying a current of known value. The magnetic field produced by magnetic transmitter 515 may travel through formation 502, which may generate magnetic field reflections. Thus, strain-sensing fibers $540_{a-c}$ may measure the composite magnetic field created directly by magnetic transmitter 515 and indirectly by the reflected magnetic field from formation 502. Because the magnetic field produced by magnetic transmitter 515 is of known magnitude, it may be subtracted from the measurement taken at strain-sensing fibers $540_{a-c}$, thereby resulting in an isolated measurement of the reflected magnetic field.

The magnitude of the reflected magnetic field may vary based on the composition of formation 502 and may depend on the resistivity of materials within formation 502. The reflected magnetic field measurements taken at strain-sensing fibers $540_{a-c}$ may be converted into resistivity measurements using techniques well known to those of skill in the art. Such resistivity measurements may be used to monitor, for example, a waterfront 508 in formation 502, which may have a relatively low resistivity. By monitoring the measurements taken over time at strain-sensing fibers $540_{a-c}$, movement in waterfront 508 may be detected.

The sensing system shown in FIG. 5 may be advantageous in production environments, where water has been injected to increase pressure on difficult-to-produce oil or to maintain pressure in a second wellbore. Distributed fiber-optic magnetic field sensing systems, such as those shown in FIG. 5, may be used to monitor the process of flood injection as well as the location of the waterfront from injected water. The waterfront may be monitored, for example, at a distance of 10-40 feet away from the production well, and thus the operator of the production well may have days or weeks of notice prior to the waterfront reaching the production well. In this way, remedial measures to avoid the accidental production of water may be taken prior to the waterfront reaching the production well, such as shutting down the affected zone.

Although the exemplary embodiment of FIG. 5 shows only three strain-sensing fibers $540_{a-c}$, additional strain-sensing fibers may be used if more than three measurement points are desired. If more strain-sensing fibers are used, a corresponding additional number of photodiodes $558_{a-c}$, optical splitters $557_{a-c}$, and conducting strips $530_{a-c}$ may be incorporated. For example, distributed measurements may be taken from a range of 900 to 1500 meters below surface level using twenty strain-sensing fibers placed at approximately thirty-meter intervals. If it is desired to use more strain-sensing fibers than may be supported for multiplexing by a single WDM coupler and/or interrogator, one or more additional distributed fiber-optic magnetic field sensing systems may be installed in parallel to the one shown in the embodiment of FIG. 5. In this way, sensing coverage of the entire borehole 504 may optionally be achieved.

Figure 6:
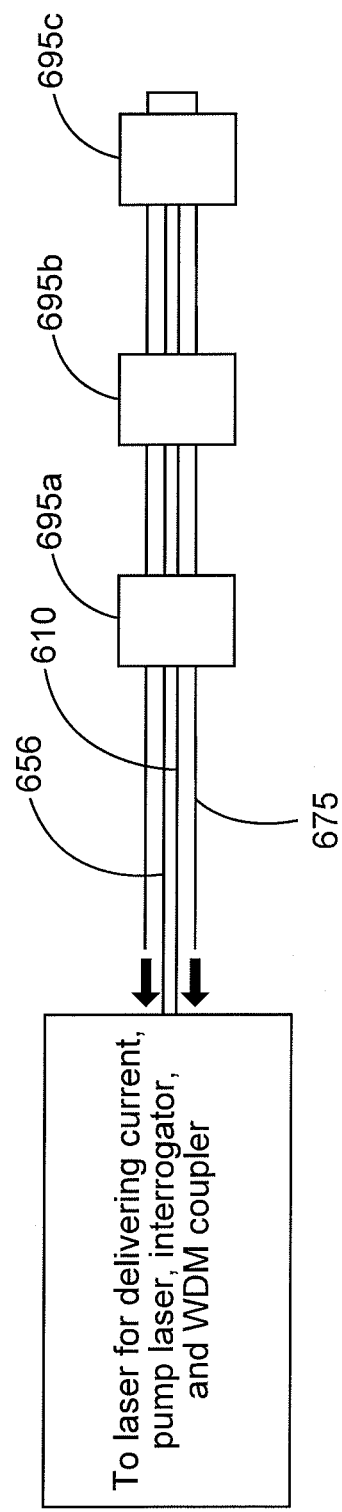
FIG. 6 illustrates an embodiment of deploying a distributed fiber-optic magnetic field sensing system into a borehole.

FIG. 6 illustrates one embodiment for deploying a distributed fiber-optic magnetic field sensing system into a borehole, as is shown for example in the embodiment of FIG. 5. In the embodiment of FIG. 6, a tube 675 may be pre-assembled at the surface, outside the borehole. Tube 675 may be made of, for example, stainless steel. The tube 675 may include an optical fiber 610 and a fiber for delivering current 656 coupled to sensor packages $695_{a-c}$. Each of the sensor packages 695 may comprise, for example, one of the conducting strips $530_{a-c}$, strain-sensing fibers $540_{a-c}$, photodiodes $558_{a-c}$, and optical splitters $557_{a-c}$ from the embodiment of FIG. 5. The sensor packages $695_{a-c}$ may also be pre-assembled to include supports, such as supports 101 and 103 in the embodiment of FIG. 1, coupled to the conducting strip and strain-sensing fiber. The tube 675 may be deployed into the borehole, for example into an annulus between a casing and a formation, and may be cemented into place. At the surface, outside of the borehole, the optical fiber 610 may be coupled to a pump laser and interrogator via a WDM coupler, and fiber for delivering current 656 may be coupled to a laser for delivering current.

Figure 7:
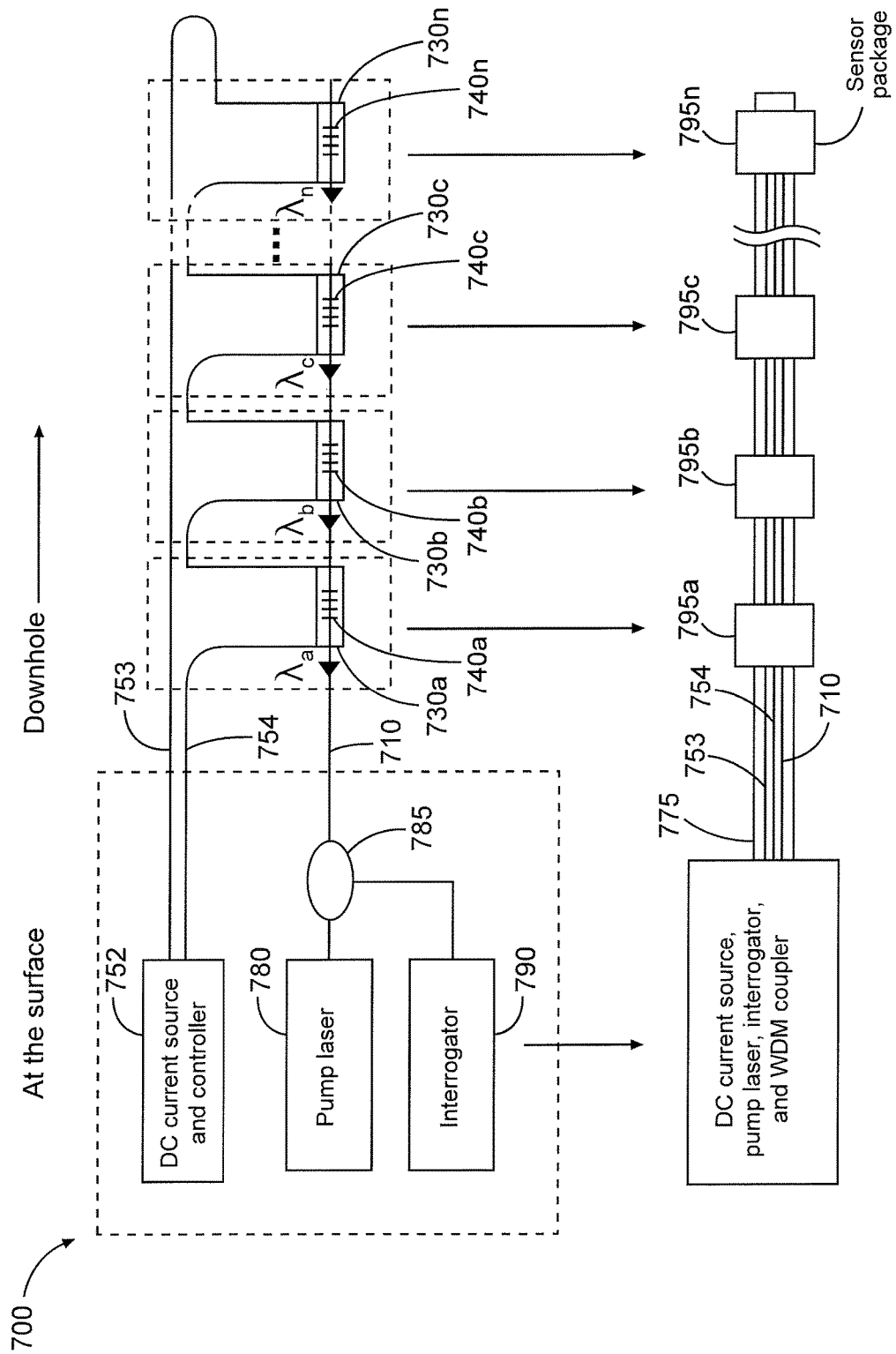
FIG. 7 is a block diagram of a distributed fiber-optic magnetic field sensing system.

FIG. 7 is a block diagram of an alternative embodiment of a distributed fiber-optic magnetic field sensing system 700. The embodiment of FIG. 7 is similar to the embodiment of FIG. 4, however instead of using a laser for delivering current 445, optical splitters $457_{a-n}$, and photodiodes $458_{a-n}$, a DC current source and controller 752 is shown coupled to conducting strips $730_{a-n}$ using copper wires 753 and 754. DC current may thereby be delivered directly to the conducting strips $730_{a-n}$ from the current source 752 via the copper wires 753 and 754. In alternative embodiments, copper wires 753 and 754 may be replaced by other electrically conductive couplings.

The embodiment of FIG. 7 may otherwise be configured similarly to the embodiment of FIG. 4. Strain-sensing fibers $740_{a-c}$ may be optically coupled to a pump laser 780 and an interrogator 790 via a WDM coupler 785. In this way, the pump laser may deliver input optical power that is transmitted along an optical fiber 710 to strain-sensing fibers $740_{a-n}$ via the WDM coupler 785, and reflected signals emitted from strain-sensing fibers $740_{a-n}$ may be transmitted back along the optical fiber 710 through the WDM coupler 785 to be received at the interrogator 790.

FIG. 7 also illustrates an embodiment for deploying the distributed fiber-optic magnetic field sensing system 700 into a borehole, similar to the embodiment of FIG. 6. A tube 775, made of stainless steel for example, may be pre-assembled at the surface and include optical fiber 710 optically coupled to pump laser 780 and interrogator 790 via a WDM coupler 785. Rather than including a fiber for delivering current as in the embodiment of FIG. 6, tube 775 may instead include copper wires 753 and 754 electrically coupled to current source 752. Each of the sensor packages 795$_{a\text{-}n}$ may comprise one of the conducting strips 730$_{a\text{-}n}$, strain-sensing fibers 740$_{a\text{-}n}$, and supports, such as supports 101 and 103 shown in FIG. 1. As with the embodiment of FIG. 6, the tube 775 may be deployed into the borehole, for example into an annulus between a casing and a formation, and may be cemented into place. Also similar to the embodiment of FIG. 6, at the surface outside the borehole, the optical fiber 710 may be coupled to pump laser 780 and interrogator 790 via a WDM coupler 785, and copper wires 753 and 754 may be coupled to DC current source and controller 752

Example simulations were run using a DFB FL coupled to a titanium strip 69 mm long, 6.5 mm wide, and 38 μm thick. The DFB FL was 50 mm long, with a coupling coefficient $\kappa=200$ m$^{-1}$, lasing wavelength of 1550 nm, and a centrally located π phase shift. The beam comprising the metal strip with the fiber laser attached to the surface was 69 mm long. Assuming that the minimum detectable interferometric phase shift is 10 μrad, for 500 mA of current, the minimum detectable magnetic field is 55 μA/m. The resonant frequency of the composite beam structure depends on the separation between the clamps, and it is preferable to work below the frequency. In the example simulations, the mechanical resonance frequency was typically 100-300 Hz, thus the minimum detectable field (sensitivity) was 55 μA/m below that frequency. The system met the sensitivity requirements for measuring a waterfront.

Thus, a person of ordinary skill in light of the present disclosure will understand that an embodiment is a sensing system including a conducting strip disposed within a borehole, a current source and strain-sensing fiber coupled to the conducting strip, and a pump laser and interrogator optically coupled to the strain-sensing fiber.

The strain-sensing fiber may optionally be a distributed feedback fiber, and the pump laser and interrogator may optionally be coupled to the strain-sensing fiber via a wavelength-division multiplexer.

The conducting strip may optionally be a plurality of conducting strips and the strain-sensing fiber may optionally be a plurality of strain-sensing fibers optically coupled in series. The current source may optionally be a laser optically coupled to the plurality of conducting strips via a plurality of photodiodes. The may optionally include a plurality of optical splitters wherein the laser is coupled to the plurality of photodiodes via the optical splitters. Alternatively, the current source may optionally be a DC current source electrically coupled to the plurality of conducting strips.

The current source, pump laser, and interrogator may optionally be disposed at a surface location outside of the borehole. The conducting strip and strain-sensing fiber may optionally be disposed within a tube.

As a person of ordinary skill in light of the present disclosure will understand, an embodiment is a method for sensing, including the steps of generating a current on a conducting strip, where the conducting strip is disposed within a borehole; laser pumping a strain-sensing fiber, where the strain-sensing fiber is coupled to the conducting strip; and determining a magnetic field magnitude by measuring strain induced on the strain-sensing fiber.

The strain-sensing fiber may optionally be a distributed feedback fiber laser. Generating a current on the conducting strip may optionally include activating a laser coupled via a photodiode to the conducting strip. Alternatively, generating a current may optionally include activating a DC current source electrically coupled to the conducting strip.

The method may optionally include determining a plurality of additional magnetic field magnitudes by measuring strain induced on a plurality of additional strain-sensing fibers optically coupled in series to the strain-sensing fiber. The method may also optionally include calculating a resistivity measurement using the magnetic field magnitude.

As a person of ordinary skill in light of the present disclosure will understand, an embodiment is a method for deploying a sensing system including disposing a tube into a borehole, where the tube include a strain-sensing fiber coupled to a conducting strip; optically coupling a pump laser and an interrogator to the strain-sensing fiber; and coupling a current source to the conducting strip.

The strain-sensing fiber may optionally be a distributed feedback fiber laser. The conducting strip may optionally be a plurality of conducting strips, and the strain-sensing fiber may optionally be a plurality of strain sensing fibers optically coupled in series. The current source may optionally be a laser and the tube may include a photodiode coupled to the conducting strip. Alternatively, the current source may optionally be a DC current source electrically coupled to the conducting strip.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that it introduces. Additionally, the terms "couple", "coupled", or "coupling" include direct or indirect coupling through intermediary structures or devices.

What is claimed is:

1. A sensing system in a formation, comprising:
   a magnetic transmitter in communication with the formation, wherein the magnetic transmitter transmits a magnetic field of a known magnitude that travels through the formation and generates a reflected magnetic field based, at least in part, on the formation;
   a conducting strip disposed within a borehole of the formation;
   a current source coupled to said conducting strip;
   a strain-sensing fiber coupled to said conducting strip such that a composite structure is formed, wherein the composite structure is coupled to a first support and a second support, wherein the strain-sensing fiber measures a composite magnetic field created directly by the magnetic transmitter and indirectly by the reflected magnetic field;

a pump laser optically coupled to said strain-sensing fiber; and an interrogator optically coupled to said strain-sensing fiber.

2. The sensing system of claim 1, wherein said strain-sensing fiber is a distributed feedback fiber.

3. The sensing system of claim 2, wherein said pump laser and said interrogator are optically coupled to said strain-sensing fiber via a wavelength-division multiplexer.

4. The sensing system of claim 1, wherein said conducting strip is a plurality of conducting strips and said strain-sensing fiber is a plurality of strain-sensing fibers optically coupled in series.

5. The sensing system of claim 4, wherein said current source is a laser optically coupled to said plurality of conducting strips via a plurality of photodiodes.

6. The sensing system of claim 5, further comprising a plurality of optical splitters, wherein said laser is coupled to said plurality of photodiodes via said plurality of optical splitters.

7. The sensing system of claim 4, wherein said current source is a DC current source electrically coupled to said plurality of conducting strips.

8. The sensing system of claim 1, wherein said current source, said pump laser, and said interrogator are disposed at a surface location outside of said borehole.

9. The sensing system of claim 1, wherein said conducting strip and said strain-sensing fiber are disposed within a tube.

10. A method for sensing, comprising:
transmitting a magnetic field of a known magnitude through a formation, wherein the transmitted magnetic field generates a reflected magnetic field based, at least in part, on the formation;
generating a current on a conducting strip, wherein said conducting strip is disposed within a borehole of the formation;
laser pumping a strain-sensing fiber, wherein said strain-sensing fiber is coupled to said conducting strip, wherein the strain-sensing fiber measures a composite magnetic field created directly by the magnetic transmitter and indirectly by the reflected magnetic field; and
determining a magnetic field magnitude based on the composite magnetic field and the known magnitude.

11. The method of claim 10, wherein said strain-sensing fiber is a distributed feedback fiber laser.

12. The method of claim 10, wherein generating a current on the conducting strip further comprises activating a laser coupled via a photodiode to said conducting strip.

13. The method of claim 10, wherein generating a current on the conducting strip further comprises activating a DC current source electrically coupled to said conducting strip.

14. The method of claim 10, further comprising determining a plurality of additional magnetic field magnitudes by measuring strain induced on a plurality of additional strain-sensing fibers optically coupled in series to said strain-sensing fiber.

15. The method of claim 10, further comprising calculating a resistivity measurement using said magnetic field magnitude.

16. A method for deploying a sensing system in a formation, comprising:
disposing a tube into a borehole of the formation, wherein said tube includes a strain-sensing fiber coupled to a conducting strip such that the strain-sensing fiber and the conducting strip form a composite structure, wherein the strain-sensing fiber measures a composite magnetic field created directly by the magnetic transmitter and indirectly by the reflected magnetic field;
supporting the composite structure with a first support and a second support;
communicatively coupling a magnetic transmitter to the formation, wherein the magnetic transmitter transmits a magnetic field of known magnitude that travels through the formation and generates a reflected magnetic field based, at least in part, on the formation;
optically coupling a pump laser to said strain-sensing fiber;
optically coupling an interrogator to said strain-sensing fiber; and
coupling a current source to said conducting strip.

17. The method of claim 16, wherein said strain-sensing fiber is a distributed feedback fiber laser.

18. The method of claim 16, wherein said conducting strip is a plurality of conducting strips, and said strain-sensing fiber is a plurality of strain-sensing fibers optically coupled in series.

19. The method of claim 16, wherein said current source is a laser and said tube further includes a photodiode coupled to said conducting strip.

20. The method of claim 16, wherein said current source is a DC current source electrically coupled to said conducting strip.

* * * * *